United States Patent
Ikenaga et al.

(10) Patent No.: US 12,266,508 B2
(45) Date of Patent: Apr. 1, 2025

(54) PLASMA PROCESSING APPARATUS AND METHOD FOR VENTING A PROCESSING CHAMBER TO ATMOSPHERE

(71) Applicant: Hitachi High-Tech Corporation, Tokyo (JP)

(72) Inventors: Kazuyuki Ikenaga, Tokyo (JP); Masaru Matsuzaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 776 days.

(21) Appl. No.: 16/953,914

(22) Filed: Nov. 20, 2020

(65) Prior Publication Data

US 2021/0074515 A1 Mar. 11, 2021

Related U.S. Application Data

(62) Division of application No. 16/124,714, filed on Sep. 7, 2018, now Pat. No. 10,886,106.

(30) Foreign Application Priority Data

Sep. 14, 2017 (WO) .................. PCT/JP2017/033240

(51) Int. Cl.
*H01L 21/00* (2006.01)
*B08B 3/04* (2006.01)
(Continued)

(52) U.S. Cl.
CPC .......... *H01J 37/32449* (2013.01); *B08B 3/04* (2013.01); *B08B 9/00* (2013.01);
(Continued)

(58) Field of Classification Search
None
See application file for complete search history.

(56) References Cited

U.S. PATENT DOCUMENTS 5,622,565 A * 4/1997 Ye .......................... C23C 14/564
118/723 R
5,928,428 A 7/1999 Horie
(Continued)

FOREIGN PATENT DOCUMENTS

JP H05245360 A 9/1993
JP H07231034 A 8/1995
(Continued)

OTHER PUBLICATIONS

Translation of JPH11244686 by Kikkai, published Sep. 14, 1999.*
(Continued)

*Primary Examiner* — Mikhail Kornakov
*Assistant Examiner* — Ryan L Coleman
(74) *Attorney, Agent, or Firm* — Miles & Stockbridge, P.C.

(57) ABSTRACT

A plasma processing apparatus includes a processing chamber in which plasma processing is performed on a wafer, a DP that reduces a pressure in the processing chamber via an evacuating pipe connected to the processing chamber, a TMP that performs evacuation such that a degree of vacuum of the processing chamber becomes a high degree of vacuum, and a stage on which the wafer is placed. Further, the plasma processing apparatus includes a He evacuating pipe that is a flow channel of a heat-transfer gas that transfers heat of the stage subjected to temperature adjustment to the wafer, a first gas supplying mechanism that supplies a gas to a portion of the evacuating pipe which is exposed to atmosphere, during venting a processing chamber to atmosphere, and a control device that controls the first gas supplying mechanism. The control device is provided to communicate with the evacuating pipe.

2 Claims, 9 Drawing Sheets

(51) Int. Cl.
*B08B 9/00* (2006.01)
*F04B 49/00* (2006.01)
*G05D 7/06* (2006.01)
*H01J 37/32* (2006.01)
*H01L 21/67* (2006.01)

(52) U.S. Cl.
CPC ........... *F04B 49/00* (2013.01); *G05D 7/0617* (2013.01); *H01J 37/32724* (2013.01); *H01J 37/32816* (2013.01); *H01L 21/67017* (2013.01); *H01L 21/67069* (2013.01); *H01L 21/67109* (2013.01); *H01L 21/67253* (2013.01); *H01J 2237/3321* (2013.01); *H01J 2237/334* (2013.01); *H01J 2237/335* (2013.01)

(56) References Cited

U.S. PATENT DOCUMENTS

| | | | |
|---|---|---|---|
| 7,767,584 | B1 | 8/2010 | Singh et al. |
| 2006/0168844 | A1* | 8/2006 | Edamura ............ G05D 16/2066 34/92 |
| 2007/0281478 | A1 | 12/2007 | Ikegami et al. |
| 2012/0227955 | A1 | 9/2012 | Koshimizu |
| 2014/0295671 | A1* | 10/2014 | Sato .................. H01J 37/32935 438/715 |

FOREIGN PATENT DOCUMENTS

| | | |
|---|---|---|
| JP | H07283152 A | 10/1995 |
| JP | H09063963 A | 3/1997 |
| JP | H09232296 A | 9/1997 |
| JP | H10125652 A | 5/1998 |
| JP | H11244686 A | 9/1999 |
| JP | 2007142284 A | 6/2007 |
| JP | 2007324341 A | 12/2007 |
| JP | 2012199535 A | 10/2012 |
| JP | 2013-147709 A | 8/2013 |

OTHER PUBLICATIONS

Office Action mailed Jul. 25, 2019 in corresponding application Korean Application No. 10-2018-0088456.
Office Action mailed Nov. 4, 2020 in corresponding Japanese Application No. 2020-004078.
Office Action mailed Jul. 23, 2019 for corresponding Japanese Application No. 2018-140436.

* cited by examiner

FIG. 5

| FLUORIDE | OXIDE | CHLORIDE | BROMIDE |
|---|---|---|---|
| $GeF_2$ | $CrO_3$ | $AlCl_3$ | $AlBr_3$ |
| $MoF_5$ | $Na_2O$ | $CuCl_2$ | $FeBr_3$ |
| $WF_4O$ | $WF_4O$ | $MoCl_{4,5}$ | $MoBr_4$ |
| $TaF_5$ | $WBr_4O$ | $NaClO_{2,4}$ | $TaBr_5$ |
| $TiF_4$ | $AlNaO_2$ | $WCl_{4,5}$ | $YBr_3$ |
| $NH_4HF_2$ | $B_2O_3$ | $TiCl_{2,3}$ | $NaBr$ |
| —— | $NH_2OH$ | $TiCl_2O$ | $NiBr_2$ |
| —— | —— | $N_2H_6Cl_2$ | $TiBr_4$ |
| —— | —— | $LaCl_3$ | $RuBr_3$ |
| —— | —— | $RuCl_3$ | $RuBr_3$ |

PLASMA PROCESSING APPARATUS AND METHOD FOR VENTING A PROCESSING CHAMBER TO ATMOSPHERE

BACKGROUND OF THE INVENTION

Field of the Invention

The present invention relates to a plasma processing apparatus and a wet cleaning technology.

Background Art

In a process of manufacturing a semiconductor device, a flat panel display, or the like, a processing technology such as plasma chemical vapor deposition (CVD) or plasma etching is used in order to form a desired pattern. In a plasma processing apparatus that performs such processing, a processing target object (processing target board) such as a semiconductor wafer is placed on a stage disposed in a processing chamber. The processing target object set on the stage is subjected to a temperature control with a heat-transfer gas that is supplied between the stage and the processing target object. For example, a processing gas such as Ar, $O_2$, $N_2$, $CHF_3$, $CH_4$, $C_5F_8$, $C_4F_8$, $CF_4$, $SF_6$, $NF_3$, HBr, $Cl_2$, or $BCl_3$ is supplied to the processing chamber. A pressure in the processing chamber is adjusted to a desired pressure by evacuating means obtained by combining a turbo molecular pump and a dry pump and pressure adjusting means for adjusting opening of a valve, for example. After the pressure of the processing chamber reaches the desired pressure, source radio frequency electric power for generating plasma is applied such that the processing gas turns into plasma. Bias radio frequency electric power for controlling incident ions is applied to the processing target object, and thereby predetermined deposition or etching is performed on the processing target object. An example of a parameter of an etching condition includes a type of gas, pressure, source radio frequency electric power, bias radio frequency electric power, a refrigerant temperature or a heater temperature for controlling a stage temperature, or the like. A processing dimension of a processing target object has been reduced, and thereby there has been a demand for a highly accurate critical dimension (CD) of a processing pattern in an etching process. In addition, a strict tolerance has been set for a level of contamination of an alkali metal or a heavy metal, which is a cause of degradation of device performance and a decrease in yield, and a size of particle on the processing target object.

The plasma processing apparatus is configured of a metal substrate made of a stainless alloy, an aluminum alloy, and the like or a ceramic substrate made of quartz, alumina, or the like. In order to suppress etching and corrosion of a substrate surface due to the processing gas, which is a cause of contamination or particle, and the plasma, a protective film such as an alumite film, an alumina spraying film, or a $Y_2O_3$ spraying film is formed on the substrate surface.

In the plasma processing apparatus, when plasma processing is performed, a reaction product is attached to an inner surface of the processing chamber. The attachment of the reaction product to the inner surface of the processing chamber brings about a change in a radical state in plasma and thus the attachment is a cause of a change in the CD. In order to maintain constant accuracy of the CD, plasma cleaning is performed in a mass production process before or after a plasma process of a processing target object, and a reaction product attached to an inner surface of a processing chamber is removed. In this manner, a surface state of the inner surface of the processing chamber is maintained to be constant. Further, the change of the radical state in plasma is suppressed, and thereby stable process performance is achieved.

For example, specification of U.S. Pat. No. 7,767,584 discloses a method of forming a coating film on an inner wall of a reactor for each process of a processing target object, thereby suppressing a change in a state of the inner wall of the reactor and a radical state in plasma, and decreasing an influence on process performance.

However, even when such stable processing is performed, a level of the CD, particle, and contamination is beyond a management value, in some cases. In this case, a seasoning process or a dummy process for restoring a state of a device to a normal state is performed; however, in a case where the normal state is not restored even when such processing is performed, wet cleaning accompanying with venting a processing apparatus to atmosphere is performed.

For example, as the wet cleaning, JP-A-H11-244686 discloses a method of supplying a heated nitrogen gas to a pipe for supplying a heat-transfer gas, in order to suppress infiltration of moisture or particle in the atmosphere or pure water used for washing a setting surface of a stage into an inside of the pipe set in the stage for supplying the heat-transfer gas, during venting a processing chamber to atmosphere. Consequently, it is described that it is possible to suppress an occurrence of outgas sing during vacuum-evacuation after the wet cleaning.

SUMMARY OF THE INVENTION

In the method disclosed in JP-A-H11-244686, in order to suppress the occurrence of outgas sing during the vacuum-evacuation after the wet cleaning, the heated nitrogen gas is supplied to the pipe for supplying the heat-transfer gas, and the infiltration of the moisture or particle in the atmosphere and the pure water used for the washing into the pipe is suppressed during the wet cleaning; however, in the method, there is no consideration of outgassing due to moisture absorbed in a reaction product attached to a pipe for evacuating the heat-transfer gas.

The heat-transfer gas is supplied during plasma processing, and thus an inner surface of a supplying pipe of the heat-transfer gas is in a clean state. On the other hand, the reaction product is attached to an inner surface of an evacuating pipe for evacuating the heat-transfer gas during the plasma processing. According to experiments conducted by the inventors of this application, in a case where the wet cleaning is performed in such a state, it turns out that there is a small effect of reducing the outgas sing during the vacuum-evacuation even when the heated nitrogen gas is supplied to the clean pipe for supplying the heat-transfer gas. Further, a leak rate indicating a state of a degree of vacuum of the plasma processing apparatus is checked. As a result, it turns out that moisture in the processing chamber does not sufficiently decrease even when the leak rate satisfies a management vale.

A type of generated reaction product varies depending on a processing gas used in plasma processing and a type of film that is subjected to etching on a processing target object. For example, when titanium (Ti) is contained in the type of film that is subjected to the etching, and the processing gas is a fluorine-based gas, fluoride such as $TiF_x$ is generated. In addition, when the processing gas is a chlorine-based gas, chloride such as $TiCl_x$ is generated. Additionally, when the processing gas is a Br-based gas or $O_2$ gas, a reaction product such as bromide or oxide is generated, respectively. The reaction product is known to have moisture absorbency.

The reaction product is mainly attached to the inner surface of the processing chamber in which the plasma is generated; however, the reaction product is attached to a portion far from a plasma generating portion, for example, an inner surface of a vacuum evacuating pipe connected to the processing chamber or an inner surface of a pipe to which a manometer that detects a pressure in the processing chamber is connected, and it is difficult to remove the reaction product attached to the portion by plasma cleaning. When the wet cleaning accompanying with the venting a processing chamber to atmosphere is performed in a state in which the reaction product having the moisture absorbency is attached to the inner surface of the pipe connected to the processing chamber, the reaction product absorbs moisture. In other words, in the method of supplying the heated nitrogen gas to the clean pipe for supplying the heat-transfer gas, it is possible to suppress adsorption of moisture in the atmosphere to the inner surface of the supplying pipe; however, it is difficult to suppress moisture absorption of the reaction product attached to the inner surface of the pipe such as the evacuating pipe which is connected to the processing chamber, thereby resulting in outgassing occurring due to moisture during vacuum evacuation.

As described above, despite of a state in which it is not possible to sufficiently decrease moisture during the vacuum evacuation, the leak rate satisfies the management value, and thus it is possible to supply the processing gas. When the processing gas is supplied in such a state, the processing gas reacts with the moisture, thereby resulting in corrosion of a substrate or a pipe which constitutes the processing chamber. Consequently, particle or contamination occurs, thereby resulting in a pattern defect of a processing target object or degradation of device performance, and thus a yield deteriorates.

An object of the invention is to provide a technology in which it is possible to reduce an occurrence of outgas sing due to moisture during vacuum evacuation of a processing chamber in wet cleaning of a plasma processing apparatus.

The object described above, objects other than the object, and new features of the invention are clarified in the description of this specification and accompanying figures.

Of the inventions disclosed in this application, the brief description of overviews of representative inventions is as follows.

According to the invention, there is provided a plasma processing apparatus including a processing chamber in which a processing target object is subjected to plasma processing; an evacuating pipe for reducing a pressure in the processing chamber having an atmospheric pressure; a stage on which the processing target object is placed; a heat-transfer gas evacuating unit that evacuates, via the evacuating pipe, a heat-transfer gas, which is supplied to a back surface of the processing target object in order to transfer heat of the stage subjected to temperature adjustment; and a first gas supplying mechanism that supplies a first gas for purging a portion of the evacuating pipe which is exposed to atmosphere. Further, the plasma processing apparatus includes a control device that controls the first gas supplying mechanism such that the first gas is continuously supplied to the portion of the evacuating pipe which is exposed to the atmosphere, during a time from after venting a processing chamber to atmosphere to a start of evacuation of the processing chamber in a case where the processing chamber opens to the atmosphere. According to the invention, there is provided another plasma processing apparatus including: a processing chamber in which a processing target object is subjected to plasma processing; an evacuating pipe for reducing a pressure in the processing chamber having an atmospheric pressure; a stage on which the processing target object is placed; a heat-transfer gas evacuating unit that evacuates, via the evacuating pipe, a heat-transfer gas which is supplied to a back surface of the processing target object in order to transfer heat of the stage subjected to temperature adjustment; and a first gas supplying mechanism that supplies a first gas for purging a portion of the evacuating pipe which is exposed to atmosphere. Further, the plasma processing apparatus includes a control device that controls the first gas supplying mechanism such that the first gas is continuously supplied to the portion of the evacuating pipe which is exposed to the atmosphere, during a time from before venting a processing chamber to atmosphere to a start of evacuation of the processing chamber in a case where the processing chamber opens to the atmosphere.

In addition, according to the invention, there is provided a method of venting a processing chamber to atmosphere, the method of venting a processing chamber to atmosphere including: continuously supplying first gas to a portion of an evacuating pipe which is exposed to atmosphere, during a time from after the venting a processing chamber to atmosphere to a start of evacuation of the processing chamber. The evacuating pipe is a pipe for reducing a pressure in the processing chamber having an atmospheric pressure and is a pipe to which a pipe for evacuating a heat-transfer gas, which is supplied to a back surface of the processing target object in order to transfer heat of the stage subjected to temperature adjustment, is connected, and the first gas is a gas for purging a portion of the evacuating pipe which is exposed to atmosphere.

Of the inventions disclosed in this application, the brief description of effects achieved by the representative inventions is as follows.

It is possible to reduce an occurrence of outgassing due to moisture during vacuum evacuation of the processing chamber in wet cleaning of the plasma processing apparatus, and thus it is possible to reduce the particle or an occurrence of contamination. In addition, it is possible to improve a yield of products.

BRIEF DESCRIPTION OF THE DRAWINGS

FIG. 5 is a table illustrating an example of a reaction product according to Embodiment 1 of the invention.

DETAILED DESCRIPTION OF THE INVENTION

Hereinafter, embodiments of the invention will be described with reference to the figures.

Embodiment 1

Figure 1:
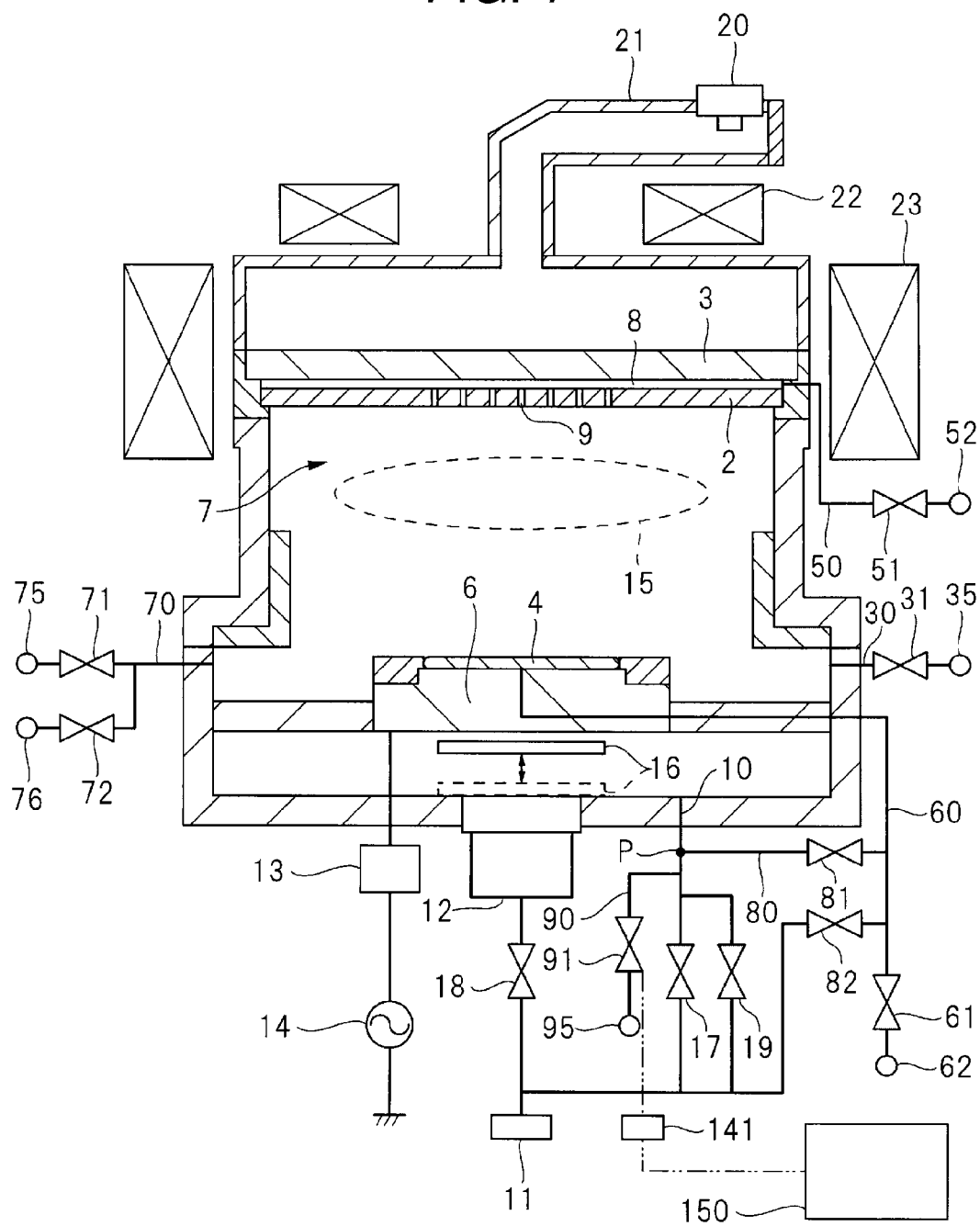
FIG. 1 is a sectional view illustrating an example of a schematic configuration of a plasma processing apparatus according to Embodiment 1 of the invention.

FIG. 1 is a sectional view illustrating an example of a schematic configuration of a plasma processing apparatus according to Embodiment 1 of the invention.

When the configuration of the plasma processing apparatus of Embodiment 1 is described with reference to FIG. 1, a stage 6, which is a stage on which a wafer 4 is placed, is installed in a processing chamber 7 in which plasma 15 is generated such that plasma processing is performed on a semiconductor wafer (hereinafter, simply referred to as a wafer) 4 made of a processing target board (processing target object). The stage 6 includes a heater (not illustrated) or a refrigerant flow channel (not illustrated) which adjusts temperature of the stage and a He supplying pipe (first pipe) 60 for supplying helium (He) that is a heat-transfer gas between the stage 6 and the wafer 4. A valve 61 is provided on the He supplying pipe 60. The valve 61 is opened in a case of supplying He and the valve 61 is closed in a case of stopping the supply of He. A He evacuating pipe (second pipe) 80 for evacuating He supplied between the stage 6 and the wafer 4 is connected to an evacuating pipe 10 for vacuum-evacuating an inside of the processing chamber 7.

In addition, a gas supply source 95 that supplies gases to the evacuating pipe 10 and the He evacuating pipe 80 is provided, and the gas supply source 95 is connected to a gas supplying pipe 90 via a valve 91. The gas supplying pipe 90 is connected to a position between a connection position of the evacuating pipe 10 to the processing chamber 7 and a position between a valve 17 and a valve 19 which block vacuum and atmosphere from each other. A control device 150 controls an opening and closing operation of the valve 91.

In addition, the plasma processing apparatus includes a processing gas supply source 52 which is a processing gas supply unit that supplies a processing gas to the processing chamber 7, a heat-transfer gas evacuating unit that reduces a pressure in the processing chamber 7 via the evacuating pipe 10 connected to the processing chamber 7 and evacuates, via the evacuating pipe 10, the heat-transfer gas, which is supplied to a back surface of the wafer 4 in order to transfer heat of the stage 6 subjected to temperature adjustment, and a heat-transfer gas supplying unit that supplies the heat-transfer gas to the stage 6.

In other words, the heat-transfer gas evacuating unit is connected to the He evacuating pipe (second pipe) 80 through which the evacuating pipe 10 communicates with the He supplying pipe (first pipe) 60 for supplying the heat-transfer gas to the stage 6. Further, the plasma processing apparatus includes a turbo molecular pump 12 that performs evacuation such that a degree of vacuum in the processing chamber 7 becomes a high degree of vacuum.

In addition, the plasma processing apparatus includes a first gas supplying mechanism 141 that supplies a first gas (for example, a $N_2$ gas or dry air) for purging a portion of the evacuating pipe 10 which is exposed to the atmosphere. The control device 150 controls the first gas supplying mechanism 141 such that the first gas is continuously supplied to the portion of the evacuating pipe 10 which is exposed to the atmosphere, during a time from after venting a processing chamber 7 to atmosphere to a start of evacuation of the processing chamber 7 in a case where wet cleaning of the processing chamber 7 is performed by accompanying with the venting a processing chamber 7 to atmosphere. The control device 150 is provided to communicate with a part (for example, a P portion illustrated in FIG. 1) of each of the evacuating pipe 10 or the He evacuating pipe 80.

In addition, an impedance matching device 13 and a radio frequency power source 14 for applying a radio frequency voltage to the wafer 4 during the plasma processing are connected to the stage 6.

In addition, a ceramic plate 3 is provided above the processing chamber 7 in order to maintain the vacuum in the processing chamber 7, and a ceramic plate 2 provided with a plurality of through-holes 9 is provided at a position at which a gap 8 is formed below the ceramic plate 3. The processing gas is supplied by the processing gas supply source 52, a flow rate of the processing gas is controlled by gas flow-rate controlling means (not illustrated), a valve 51 provided on a processing gas supplying pipe 50 is opened, and the processing gas is uniformly supplied to the processing chamber 7 from the through-holes 9 via the gap 8.

In addition, a pipe 70 is connected to the processing chamber 7, and high-vacuum pressure detecting means (pressure detecting unit) 75 for detecting a pressure in high vacuum and low-vacuum pressure detecting means (pressure detecting unit) 76 for detecting a pressure in low vacuum are provided via the pipe 70 in the processing chamber. Further, a valve 71 and a valve 72 are each provided between each of the pressure detecting means and the processing chamber 7. The low-vacuum pressure detecting means 76 is used from the atmospheric pressure to a predetermined pressure, the high-vacuum pressure detecting means 75 is used from the predetermined pressure to the high vacuum, and the pressure in the processing chamber 7 is detected by the high-vacuum pressure detecting means 75 during the plasma processing.

In addition, intermediate-vacuum pressure detecting means and a valve for detecting a pressure in the intermediate vacuum are provided in some cases, and thereby a pressure is also detected by the intermediate-vacuum pressure detecting means during the plasma processing.

In order to control the pressure in the processing chamber 7, pressure adjusting means 16, which is a pressure adjusting mechanism, and the turbo molecular pump (TMP) 12 which is evacuating means are provided in the processing chamber 7. In addition, a valve 18 is provided between the dry pump (DP) 11 and the TMP 12. Here, the DP 11 is the heat-transfer gas evacuating unit.

In addition, the pressure adjusting means 16 also plays a role of a valve. Of the valve 17 and the valve 19 which are connected to the evacuating pipe 10, the valve 17 is a slow-evacuating valve for performing slow evacuation of the processing chamber 7 by the DP 11 from the atmospheric pressure to the vacuum, and the valve 19 is a main evacuating valve for performing quick evacuation by the DP 11.

The wafer 4 is transported into the processing chamber 7 by a transport device not illustrated and is placed on the stage 6. An electrode (not illustrated) for electrostatic adsorption is provided in the stage 6, and the wafer 4 placed on the stage 6 is held by applying a voltage to the electrode. He (heat-transfer gas) is supplied between the wafer 4 and the stage 6 from a He supply source 62 which is a heat-transfer gas supply unit, heat of the stage 6 is transferred to the wafer 4 via He, and a temperature of the wafer 4 is adjusted.

In addition, around the processing chamber 7, a magnetron oscillator 20 that outputs a microwave and a waveguide 21 for propagating the microwave to the processing chamber 7 are provided. In addition, a solenoid coil 22 and a solenoid coil 23 which are magnetic field generating means are provided above and in front of the processing chamber 7. The microwave oscillated from the magnetron oscillator 20 is propagated in the waveguide 21 and radiates to the processing chamber 7 via the ceramic plate 3 and the ceramic plate 2. Electron cyclotron resonance (ECR) is generated due to an interaction between an electric field generated by the microwave and a magnetic field generated by the solenoid coil 22 and the solenoid coil 23, and thereby the plasma 15 is generated.

The plasma 15 is generated in the processing chamber 7, a radio frequency voltage is applied to the wafer 4 placed on the stage 6, and thereby an etching process is performed following a processing pattern formed on the wafer 4. Reaction products are attached to the inside of the processing chamber 7 by the etching process. In addition, reaction products are slightly attached to an inside of the evacuating pipe 10 or the He evacuating pipe 80 which is a pipe connected to the processing chamber 7. FIG. 5 illustrates an example of the reaction product. The reaction products are known to have moisture absorption in a reference literature (reference literature: Revised fourth Edition, Chemical Handbook Basic 1, The Chemical Society of Japan).

After the etching process, supply of the microwave, the magnetic field, the radio frequency voltage, and the processing gas is stopped, and the high-vacuum evacuation of the processing chamber 7 is performed. At this time, the valve 61 is closed, then a valve 81 is opened, and evacuation of He supplied between the wafer 4 and the stage 6 is performed in the processing chamber 7 via the He evacuating pipe 80 and the evacuating pipe 10. As another method, a valve 82 is opened in a state in which the valve 61 and the valve 81 are closed, and He is evacuated by the DP 11. Then, the valve 82 is closed, and the valve 81 is opened. Consequently, evacuation of the processing chamber 7 to high vacuum is performed via the He evacuating pipe 80 and the evacuating pipe 10.

After the high-vacuum evacuation, the wafer 4 is taken out, and plasma cleaning is performed in the processing chamber 7. The plasma cleaning may be performed after the dummy wafer 4 is placed on the stage 6 or may be performed without using the dummy wafer 4.

It is possible to remove the reaction product attached to the inside of the processing chamber 7 by the plasma cleaning; however, it is difficult to perform the plasma cleaning on the inner surface of the evacuating pipe 10 connected to the processing chamber 7 or the He evacuating pipe 80 that is connected to the evacuating pipe 10. Therefore, even when a slight amount of the reaction product is attached during the etching process once, an attachment amount of the reaction product increases as the process is repeatedly performed. However, the attachment amount of the reaction product is small to the extent that it is difficult to visually check the amount.

Figure 2:
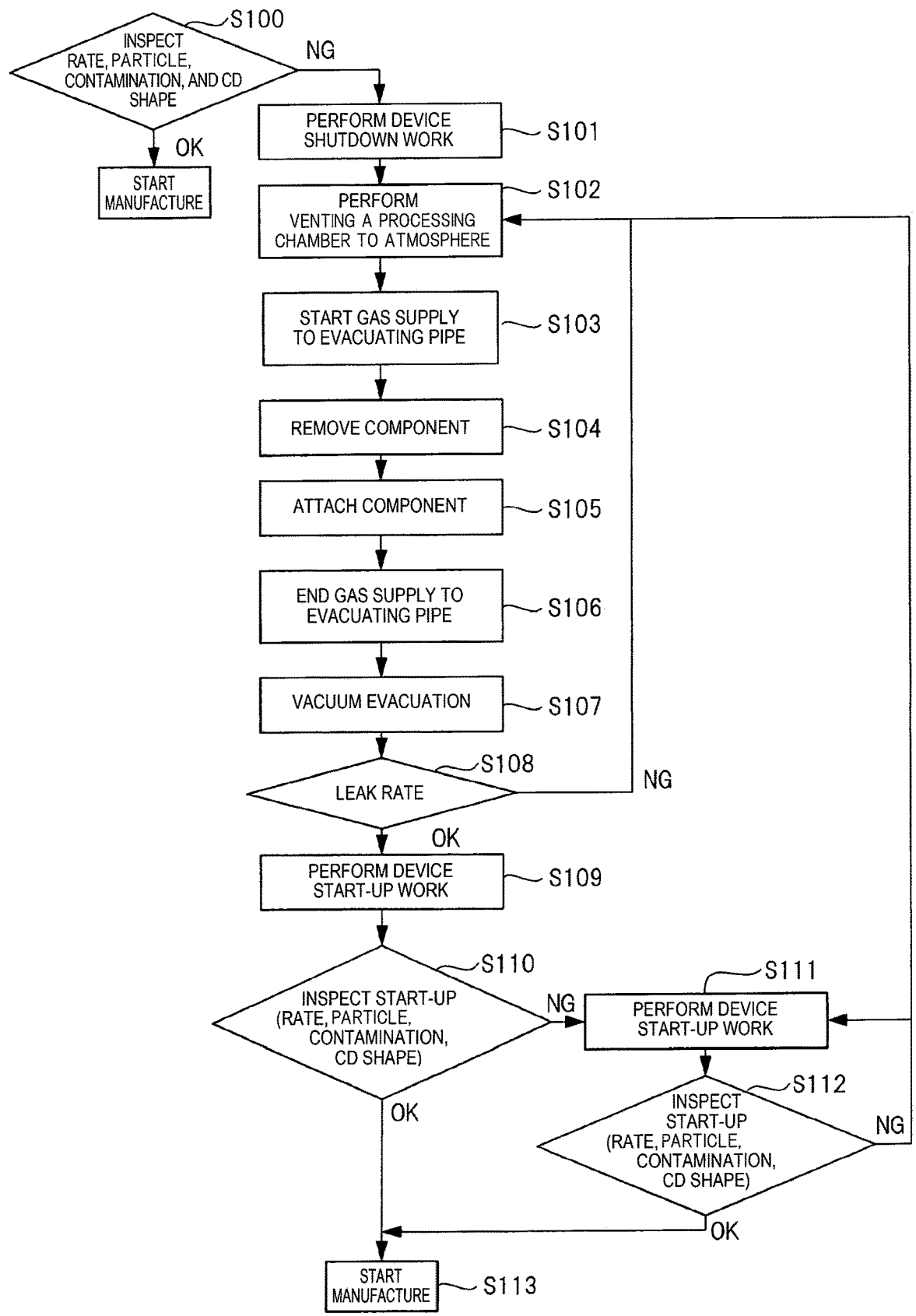
FIG. 2 is a flowchart illustrating an example of a procedure of wet cleaning of the plasma processing apparatus illustrated in FIG. 1.

Next, FIG. 2 illustrates an example of a procedure from a start to an end of the wet cleaning of the plasma processing apparatus illustrated in FIG. 1. First, in order to determine whether a state of the plasma processing apparatus is normal, an etch rate, a CD shape, particle, contamination, or the like is inspected (S100). As a result of the inspection, in a case where any one of various types of numerical values is beyond a management value, a seasoning process or a dummy process for restoring the state of the plasma processing apparatus to a normal state is performed; however, in a case where the normal state is not restored even when the processing is performed, wet cleaning accompanying with venting a processing apparatus to atmosphere is performed.

Before the wet cleaning is started, device shutdown work (S101) is performed. In the device shutdown work (S101), the plasma cleaning or the like for removing the reaction product attached to the inside of the processing chamber 7 or gas molecules adsorbed to the inside thereof is performed. In addition, in order to evacuate a residual gas in the processing gas supplying pipe 50, purging evacuation, in which a gas such as $N_2$ is repeatedly supplied and evacuated, or the like is also performed. After the device shutdown work (S101) is completed, the plasma processing apparatus comes into a state in which a valve 31, a valve 51, the valve 61, the valve 81, the valve 82, the valve 17, the valve 19, the valve 91, and the valve 72 are closed.

Next, venting a processing chamber 7 to atmosphere is performed. Here, in order to stop vacuum evacuation, the pressure adjusting means 16 and the valve 71 are closed, and the valve 72 is opened. Then, the valve 31 is opened, and a gas is supplied from a gas supply source 35 of $N_2$, dry air, or the like into the processing chamber 7 via a vent pipe 30 connected to the processing chamber 7. When the pressure in the processing chamber 7 is detected by the low-vacuum pressure detecting means 76 and becomes the atmospheric pressure, the valve 31 is closed.

Figure 9:
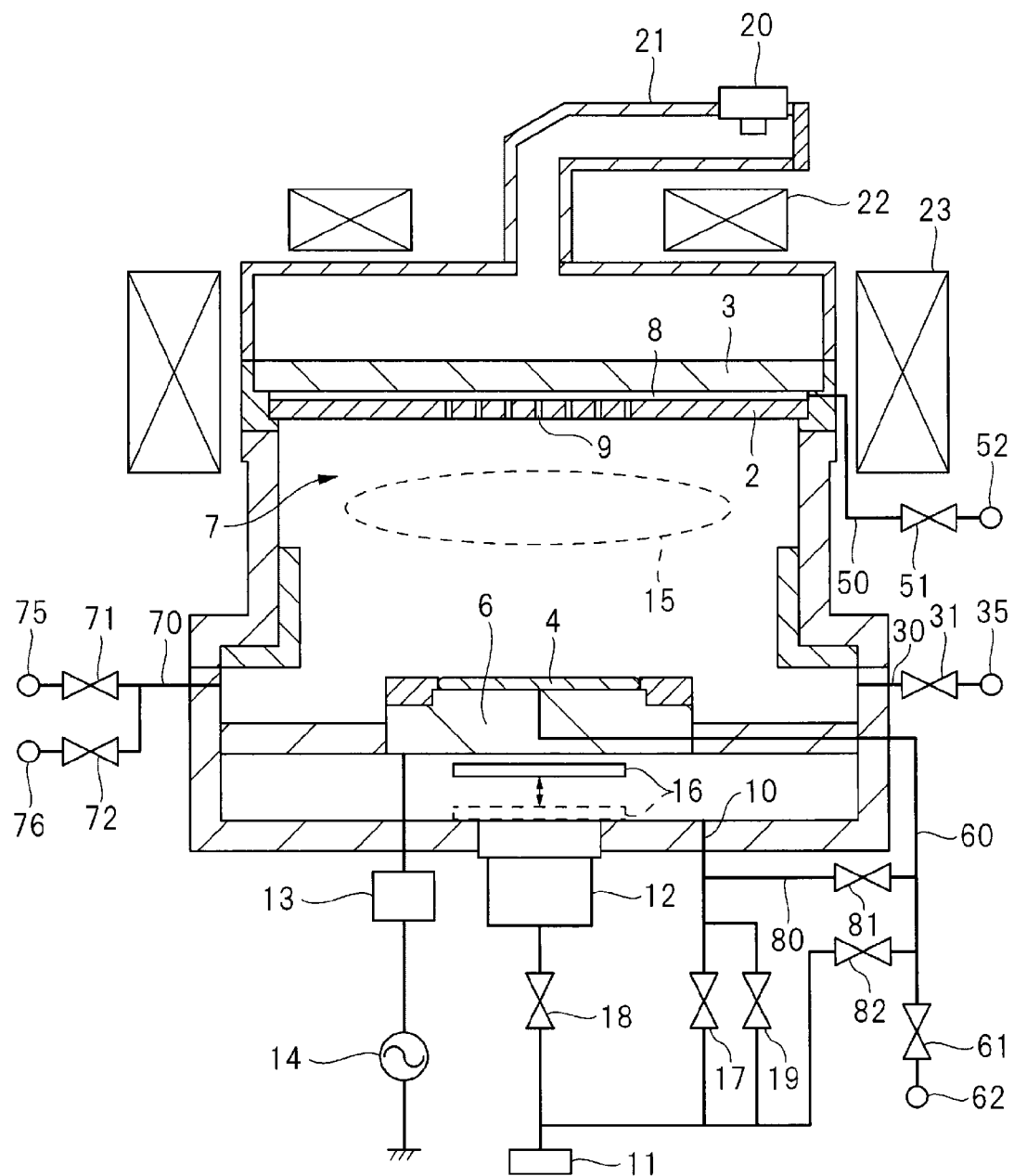
FIG. 9 is a sectional view illustrating a schematic configuration of a plasma processing apparatus according to a comparative example.

Here, FIG. 9 is a sectional view illustrating a schematic configuration of a plasma processing apparatus according to a comparative example used in a comparative study by the inventors of this application. In the plasma processing apparatus of the comparative example illustrated in FIG. 9, since the ceramic plate 3, which constitutes the processing chamber 7, is detached, for example, without supplying a gas to the evacuating pipe 10, the atmosphere reaches the evacuating pipe 10. A clean room, in which the plasma processing apparatus is installed, is a space in which a temperature and humidity is controlled; however, the humidity in the clean room is 30% to 50%. As described above, since the reaction product is attached to an inner surface of the evacuating pipe 10, the reaction product attached to the inner surface of the evacuating pipe 10 is likely to absorb moisture in the atmosphere.

In the plasma processing apparatus of Embodiment 1 illustrated in FIG. 1, after the pressure in the processing chamber 7 reaches the atmospheric pressure, the valve 91 is opened before the ceramic plate (component constituting the processing chamber 7) 3 is detached, and the gas (first gas) is supplied from the gas supply source 95 of the gas such as $N_2$ or dry air at least to the evacuating pipe 10 via the gas supplying pipe 90 (S103). The gas supply source 95 and the gas supply source 35 may be the same as each other or may be different from each other. Before the atmosphere is mixed in the processing chamber 7, a gas is supplied to the evacuating pipe 10, and thereby it is possible to suppress absorption of the moisture in the atmosphere by the reaction product attached to the inner surface of the evacuating pipe 10 even after the ceramic plate (component) 3 is detached (S104). In addition, even after the ceramic plate 3 is detached, the gas is continuously supplied to the evacuating pipe 10. Therefore, it is also possible to suppress the absorption of the moisture in the atmosphere by the reaction product attached to the inner surface of the evacuating pipe 10 from the detachment of a component constituting the processing chamber 7 to attachment of a clean component (S105). Thus, when various components such as the ceramic plate 3 constituting the processing chamber 7 are attached, and there is no concern that the atmosphere will be mixed in the processing chamber 7, the valve 91 is closed, and gas supply to the evacuating pipe 10 is stopped (S106). Consequently, it is possible to suppress the absorption of the moisture by the reaction product that is attached to the evacuating pipe 10.

Next, the vacuum evacuation (S107) in the processing chamber 7 is performed. In the vacuum evacuation (S107), the valve 18 is closed, and the valve 17 for the slow evacuation is opened. The valve 17 is opened, and the vacuum evacuation in the processing chamber 7 is performed slowly (at a first speed) from the atmospheric pressure by the DP 11 via the evacuating pipe 10. In this manner, it is possible to suppress flying of particle, moisture condensation, or the like due to a rapid pressure fluctuation or disturbance of airflow. When the pressure in the processing chamber 7 reaches a predetermined pressure, the valve 17 is closed, and the valve 19 for main evacuation is opened. The valve 19 is opened such that the evacuation is performed at a high speed (second speed faster than the first speed), and thus it is possible to shorten a time for the vacuum evacuation. The vacuum evacuation is performed by the DP 11 via the valve 19 until the pressure in the processing chamber 7 reaches the predetermined pressure such as 100 Pa. When the pressure in the processing chamber 7 reaches 100 Pa, the valve 72 is closed, the valve 71 is opened, and the pressure in the processing chamber 7 is detected by the high-vacuum pressure detecting means (pressure detecting unit) 75. In addition, after the valve 19 is closed, and the valve 18 is opened, the pressure adjusting means 16 is opened, and the high-vacuum evacuation in the processing chamber 7 is performed by the TMP 12.

After the high-vacuum evacuation, a leak rate in the processing chamber 7 is checked (S108). When it is not possible for the leak rate to satisfy a predetermined management value, the venting a processing chamber 7 to atmosphere is again performed. When it is possible for the leak rate to satisfy the predetermined management value, the device start-up work (S109) for starting to manufacture products is performed. In the device start-up work (S109), the temperature adjustment, the seasoning process, the dummy process, or the like of the plasma processing apparatus is performed. Then, start-up inspection (S110) of the leak rate, the CD shape, the particle, the contamination, or the like is performed. As a result of the inspection, when it is not possible for an obtained value to satisfy the predetermined management value, device start-up work (S111) and start-up inspection (S112) of the seasoning process, the dummy process, or the like are performed. When the inspection results all satisfy the predetermined value, a start (S113) of manufacturing products is started.

Here, results of a study on effects achieved by supplying the gas to the evacuating pipe 10 during the venting a processing chamber to atmosphere, which is a characteristic of Embodiment 1, are described. In this experiment, actual wet cleaning was simulated, and a moisture content in the middle of the vacuum evacuation in the processing chamber 7 by the TMP 12 after the venting a processing chamber to atmosphere was measured for four hours of venting a processing chamber 7 to atmosphere time.

Figure 3:
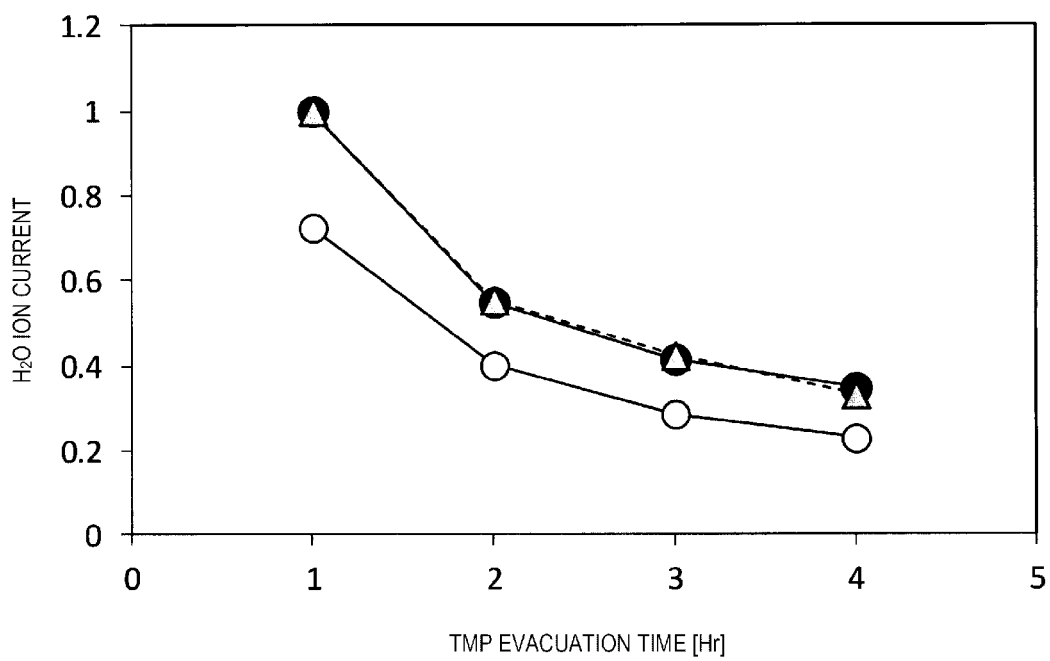
FIG. 3 is a graph illustrating an example of a relationship between an evacuation time and a moisture content in a turbo molecular pump of the plasma processing apparatus illustrated in FIG. 1.

FIG. 3 is a graph illustrating an example of a relationship between an evacuation time and a moisture content in the turbo molecular pump of the plasma processing apparatus illustrated in FIG. 1. In other words, FIG. 3 illustrates a result of measurement the moisture content (mass No. 18) during the vacuum evacuation by the TMP 12 with a quadrupole mass spectrometer (QMS) in the comparative example (a case of using the plasma processing apparatus illustrated in FIG. 9) and Embodiment 1 (a case of using the plasma processing apparatus illustrated in FIG. 1). In FIG. 3, the vertical axis represents a value obtained by normalizing an ion current value of water ($H_2O$) which is measured with the QMS, and the horizontal axis represents an elapsed time from the start of the vacuum evacuation by the TMP 12. In FIG. 3, 3-1 represents a result obtained when no gas is supplied to any of the He supplying pipe 60, the evacuating pipe 10, and the He evacuating pipe 80 during the venting a processing chamber 7 to atmosphere at the time of the wet cleaning. In FIG. 3, 3-2 represents a result obtained when a gas is supplied only to the He supplying pipe 60. In FIG. 3, 3-3 represents a result obtained when gases are simultaneously supplied to the He supplying pipe 60, the evacuating pipe 10, and the He evacuating pipe 80. Embodiment 1 is characterized in that the gas is supplied to the evacuating pipe 10; however, it is possible to check an effect of suppressing the moisture content during the vacuum evacuation by supplying the gas to the evacuating pipe 10 and the He evacuating pipe 80 by an amount obtained by a difference between 3-2 in FIGS. 3 and 3-3 in FIG. 3.

From the result in FIG. 3, in the case (3-1 in FIG. 3) where no gas is supplied during the venting a processing chamber to atmosphere and the case (3-2 in FIG. 3) where the gas is supplied only to the He supplying pipe 60 during the venting a processing chamber to atmosphere, it is known that moisture contents, which decrease during the vacuum evacuation, are almost the same as each other. In other words, even when the gas is supplied to the He supplying pipe 60 having an inner surface which is in a clean state during the venting a processing chamber to atmosphere as in the comparative example, an effect of decreasing the moisture content during the vacuum evacuation is shown to be small. On the other hand, in the case (3-2 in FIG. 3) where the gas is supplied only to the He supplying pipe 60 during the venting a processing chamber to atmosphere and the case (3-3 in FIG. 3) where the gas is simultaneously supplied to the He supplying pipe 60, the evacuating pipe 10, and the He evacuating pipe 80, it is known that the moisture content of 3-3 in FIG. 3 is decreased by 25% to 30% for the entire elapsed time from the start of the evacuation by the TMP 12, when the moisture contents during the vacuum evacuation are compared to each other. From the results of 3-1 in FIGS. 3 and 3-2 in FIG. 3, it turns out that the effect of decreasing the moisture content during the vacuum evacuation is small even when the gas is supplied to the He supplying pipe 60. Therefore, the result from FIG. 3 shows that an effect of decreasing the moisture content during the vacuum evacuation is achieved by supplying the gas to the evacuating pipe 10 and the He evacuating pipe 80 during the venting a processing chamber to atmosphere. In other words, the gas is supplied to the evacuating pipe 10 and the He evacuating pipe 80 during the venting a processing chamber to atmosphere, and thereby it is possible to suppress the absorption of the moisture by the reaction product attached to the evacuating pipe 10 and the He evacuating pipe 80. Therefore, it is possible to decrease the moisture content during the vacuum evacuation. It is needless to say that, even by supplying the gas only to the evacuating pipe 10 during the venting a processing chamber to atmosphere, it is possible to suppress the absorption of the moisture by the reaction product attached to the evacuating pipe 10.

Figure 4:
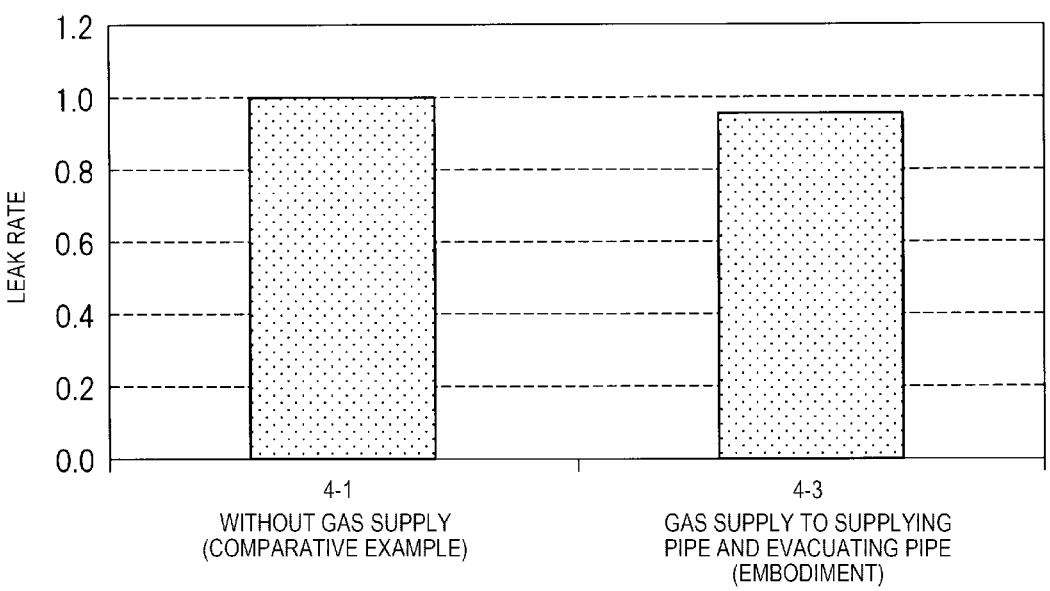
FIG. 4 is a graph illustrating a leak rate according to Embodiment 1 of the invention.

Next, FIG. 4 is a graph illustrating the leak rate according to Embodiment 1 of the invention, specifically, illustrating the leak rate obtained when the processing gas is supplied and the rate satisfies the predetermined management value in which it is possible to perform the etching process. The leak rate is a result obtained after four hours after the vacuum evacuation is started by the TMP 12. The vertical axis in FIG. 4 represents a value obtained by normalizing the leak rate. In FIG. 4, 4-1 represents a result obtained when no gas is supplied to any of the He supplying pipe 60, the evacuating pipe 10, and the He evacuating pipe 80 during the venting a processing chamber 7 to atmosphere at the time of the wet cleaning. In FIG. 4, 4-3 represents a result obtained when gases are simultaneously supplied to the He supplying pipe 60, the evacuating pipe 10, and the He evacuating pipe 80. In FIG. 4, 4-1 does not represent a result of the leak rate obtained when a gas is supplied only to the He supplying pipe 60 similarly to the comparative example, it is assumed that the results in FIG. 3 and the result of 4-1 in FIG. 4 are the same result as the result of the leak rate obtained when the gas is supplied only to the He supplying pipe 60.

The results in FIG. 4 show that the leak rates, which satisfy the predetermined management value obtained after four hours from the start of the vacuum evacuation by the TMP 12, are substantially the same as each other in both of a case where no gas is supplied during the venting a processing chamber to atmosphere and a case where the gas is simultaneously supplied to the He supplying pipe 60, the evacuating pipe 10, and the He evacuating pipe 80. Regardless of a difference of about 30% in the moisture content after four hours in the results in FIG. 3, the leak rate satisfies the management value. Therefore, in the plasma processing apparatus of the comparative example, it is also possible to supply the processing gas in a state in which the moisture in the processing chamber 7 is not sufficiently decreased. As a result, in the plasma processing apparatus of the comparative example, when the processing gas is supplied, the processing gas reacts with the moisture, thereby resulting in corrosion of a substrate or a pipe which constitutes the processing chamber 7.

In the plasma processing apparatus of Embodiment 1 illustrated in FIG. 1, the leak rate satisfies the management value, and the moisture in the processing chamber 7 is sufficiently decreased. Therefore, even when the processing gas is supplied, the processing gas is not caused to react with the moisture, and thus it is possible to prevent the substrate or the pipe, which constitutes the processing chamber 7, from being corroded.

As described above, in Embodiment 1, the gas is supplied to the evacuating pipe 10 in the wet cleaning accompanying with the venting a processing chamber to atmosphere, and thereby it is possible to suppress the absorption of the moisture by the reaction product attached to the evacuating pipe 10 due to mixing with the atmosphere. Therefore, it is possible to reduce the occurrence of outgassing due to the moisture during the vacuum evacuation. In addition, the decrease in the moisture during the vacuum evacuation enables the substrate or the pipe, which constitutes the processing chamber 7, from being corroded even when the processing gas is supplied, and thus it is possible to reduce the particle and the occurrence of contamination. Consequently, it is possible to reduce a pattern defect or degradation of device performance, and thus it is possible to improve a yield of products.

In Embodiment 1, the case where the gas (first gas) is supplied only to the evacuating pipe 10 in the wet cleaning accompanying with the venting a processing chamber to atmosphere is described; however, it is needless to say that the gas may be supplied to the evacuating pipe 10 and the He evacuating pipe (second pipe) 80. For example, in the processing procedure of the plasma processing apparatus in FIG. 2, the evacuating pipe in S103 and S106 indicates both of the evacuating pipe 10 and the He evacuating pipe 80 in some cases. As described above, the gas is supplied to the evacuating pipe 10 and the He evacuating pipe 80, and thereby it is possible to suppress the absorption of the moisture by the attached reaction product due to mixing with the atmosphere in each of both pipes. Therefore, it is possible to reduce the occurrence of outgassing due to the moisture during the vacuum evacuation. In Embodiment 1, the case where the gas is supplied only to the evacuating pipe 10 in the wet cleaning accompanying with the venting a processing chamber to atmosphere is described; however, the invention is applicable to the pipe 70 including the high-vacuum pressure detecting means 75 and the low-vacuum pressure detecting means 76 which are connected to the processing chamber 7.

Embodiment 2

In Embodiment 2, a case where the invention is applied to the pipe 70 including the high-vacuum pressure detecting means 75 and the low-vacuum pressure detecting means 76 which are connected to the processing chamber 7 in the wet cleaning accompanying with the venting a processing chamber to atmosphere is described.

Figure 6:
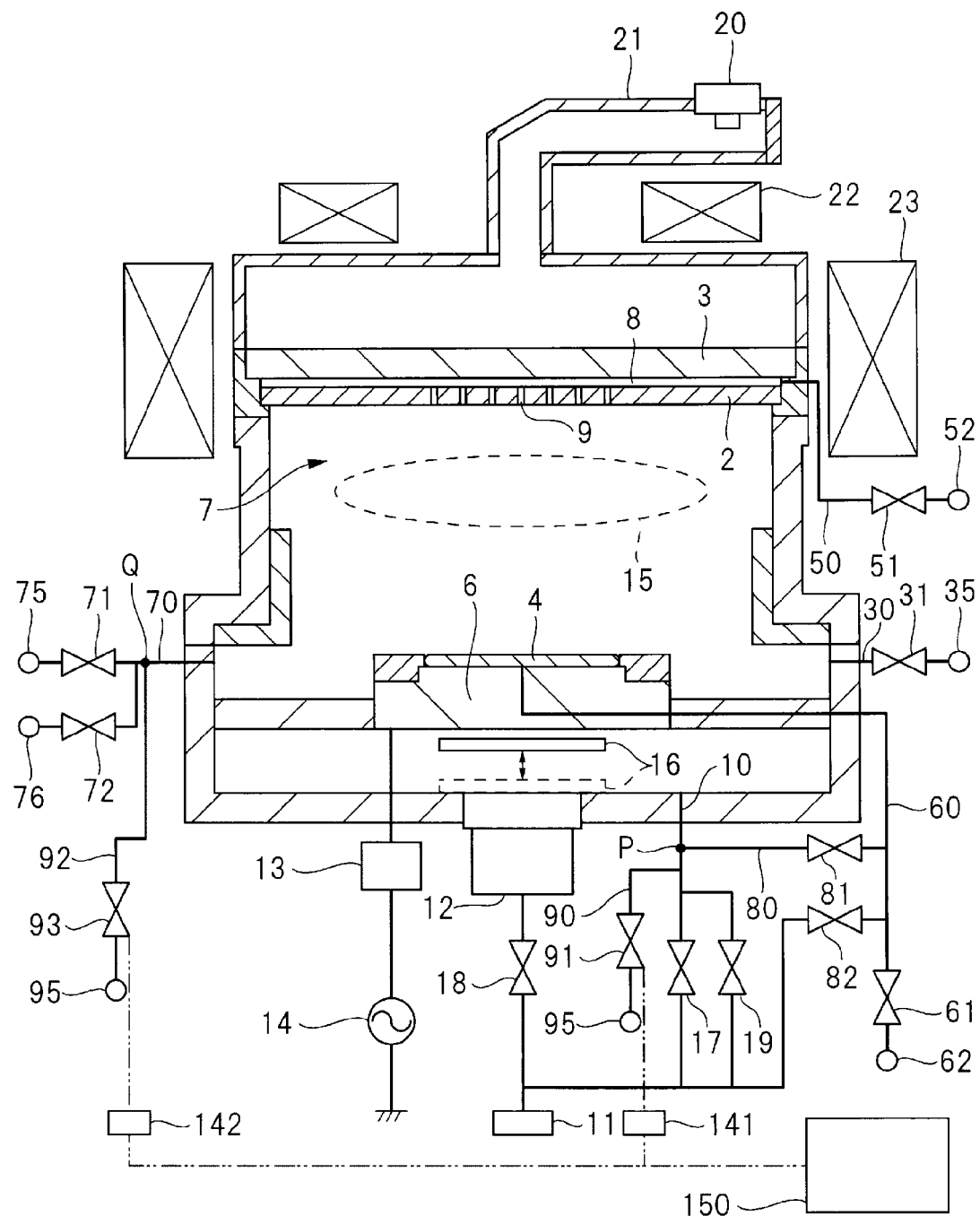
FIG. 6 is a sectional view illustrating an example of a schematic configuration of a plasma processing apparatus according to Embodiment 2 of the invention.

FIG. 6 is a sectional view illustrating an example of a schematic configuration of a plasma processing apparatus according to Embodiment 2 of the invention. A case where the gas is supplied to the pipe 70 in the wet cleaning accompanying with the venting a processing apparatus to atmosphere illustrated in FIG. 6 is described. In FIG. 6, configurations, to which the same reference signs as those in FIG. 1 are assigned, have the same functions as those described in Embodiment 1, and thus the description thereof is omitted.

In the plasma processing apparatus of Embodiment 2 illustrated in FIG. 6, the pipe 70 is connected to the processing chamber 7, and thereby the high-vacuum pressure detecting means 75 and the low-vacuum pressure detecting means 76 are connected to the pipe 70. Further, the pipe 70 includes the gas supply source 95, which supplies the gas such as $N_2$ or dry air. The gas supply source 95 is connected to a gas supplying pipe 92 via a valve 93. The gas supplying pipe 92 is connected to a portion (for example, a Q portion illustrated in FIG. 2) between a connection position of the pipe 70 to the processing chamber 7 and the valve 71 which blocks vacuum and atmosphere from each other. Further, a second gas supplying mechanism 142 is provided to communicate with the pipe 70. The second gas supplying mechanism 142 supplies a second gas for purging a portion of the pipe 70 which is exposed to the atmosphere, the pipe being provided for allowing the processing chamber 7 to communicate with a pressure detecting unit that detects the pressure in the processing chamber 7. Examples of the second gas include $N_2$, dry air, or the like. The control device 150 controls the second gas supplying mechanism 142. Consequently, the control device 150 controls an opening and closing operation of the valve 93. Here, the control device 150 controls the second gas supplying mechanism 142 such that the second gas is continuously supplied to the portion of the pipe 70 which is exposed to the atmosphere, during a time from after the venting a processing chamber 7 to atmosphere to a start of evacuation of the processing chamber 7 in a case where the wet cleaning of the processing chamber 7 is performed by accompanying with the venting a processing chamber 7 to atmosphere. The gas supply source 95 may be the same as or different from the gas supply source 95 described in Embodiment 1.

Reaction products are slightly attached to an inside of the pipe 70 that is connected to the processing chamber 7, due to the etching process. Similar to the inner surface of the evacuating pipe 10 or the He evacuating pipe 80, it is difficult to perform the plasma cleaning on the inner surface of the pipe 70, and thus the attachment amount of the reaction product gradually increases as the etching process is repeatedly performed. However, the attachment amount of the reaction product is small to the extent that it is difficult to visually check the amount.

When the wet cleaning accompanying with the venting a processing chamber to atmosphere is performed on the processing chamber 7 in such as state, the atmosphere reaches the pipe 70 when the ceramic plate (component) 3 is detached, for example. As described above, since the reaction product is attached to the inner surface of the pipe 70, the reaction product attached to the inner surface of the pipe 70 is likely to absorb moisture in the atmosphere.

In Embodiment 2, after the pressure in the processing chamber 7 reaches the atmospheric pressure, the valve 93 is opened before the ceramic plate 3 is detached, and the gas is supplied from the gas supply source 95 of $N_2$, dry air, or the like to the pipe 70 via the gas supplying pipe 92. Before the atmosphere is mixed in the processing chamber 7, a gas is supplied to the pipe 70, and thereby it is possible to suppress absorption of the moisture in the atmosphere by the reaction product attached to the inner surface of the pipe 70 even after the ceramic plate (component) 3 is detached. In addition, even after the ceramic plate 3 is detached, the gas is continuously supplied to the pipe 70. Therefore, it is also possible to suppress the absorption of the moisture in the atmosphere by the reaction product attached to the inner surface of the pipe 70 from the detachment of the component such as the ceramic plate 3 constituting the processing chamber 7 to attachment of a clean component. Then, when various components such as the ceramic plate 3 constituting the processing chamber 7 are attached, and there is no concern that the atmosphere will be mixed in the processing chamber 7, the valve 93 is closed, and gas supply to the pipe 70 is stopped. Consequently, it is possible to suppress the absorption of the moisture by the reaction product that is attached to the pipe 70.

As described above, in the pipe 70 including a pressure detecting unit such as the high-vacuum pressure detecting means 75 or the low-vacuum pressure detecting means 76 which are connected to the processing chamber 7 described in Embodiment 2, the gas is supplied to the pipe 70 in the wet cleaning accompanying with the venting a processing chamber to atmosphere, and thereby it is possible to suppress the absorption of the moisture by the reaction product attached to the pipe 70 due to mixing with the atmosphere. Consequently, it is possible to reduce the occurrence of outgassing due to the moisture during the vacuum evacuation. In addition, the decrease in the moisture during the vacuum evacuation enables the substrate or the pipe, which constitutes the processing chamber 7, from being corroded even when the processing gas is supplied, and thus it is possible to reduce the particle and the occurrence of contamination. Consequently, it is possible to reduce the pattern defect or the degradation of device performance, and thus it is possible to improve the yield of products.

In Embodiment 2, the case where the gas is supplied to the pipe 70 including the pressure detecting units connected to the processing chamber 7 in the wet cleaning accompanying with the venting a processing chamber to atmosphere is described; however, the invention is applicable to the vent pipe 30 connected to the processing chamber 7.

Embodiment 3

In Embodiment 3, a case where the invention is applied to the vent pipe 30 connected to the processing chamber 7 in the wet cleaning accompanying with the venting a processing chamber to atmosphere is described.

Figure 7:
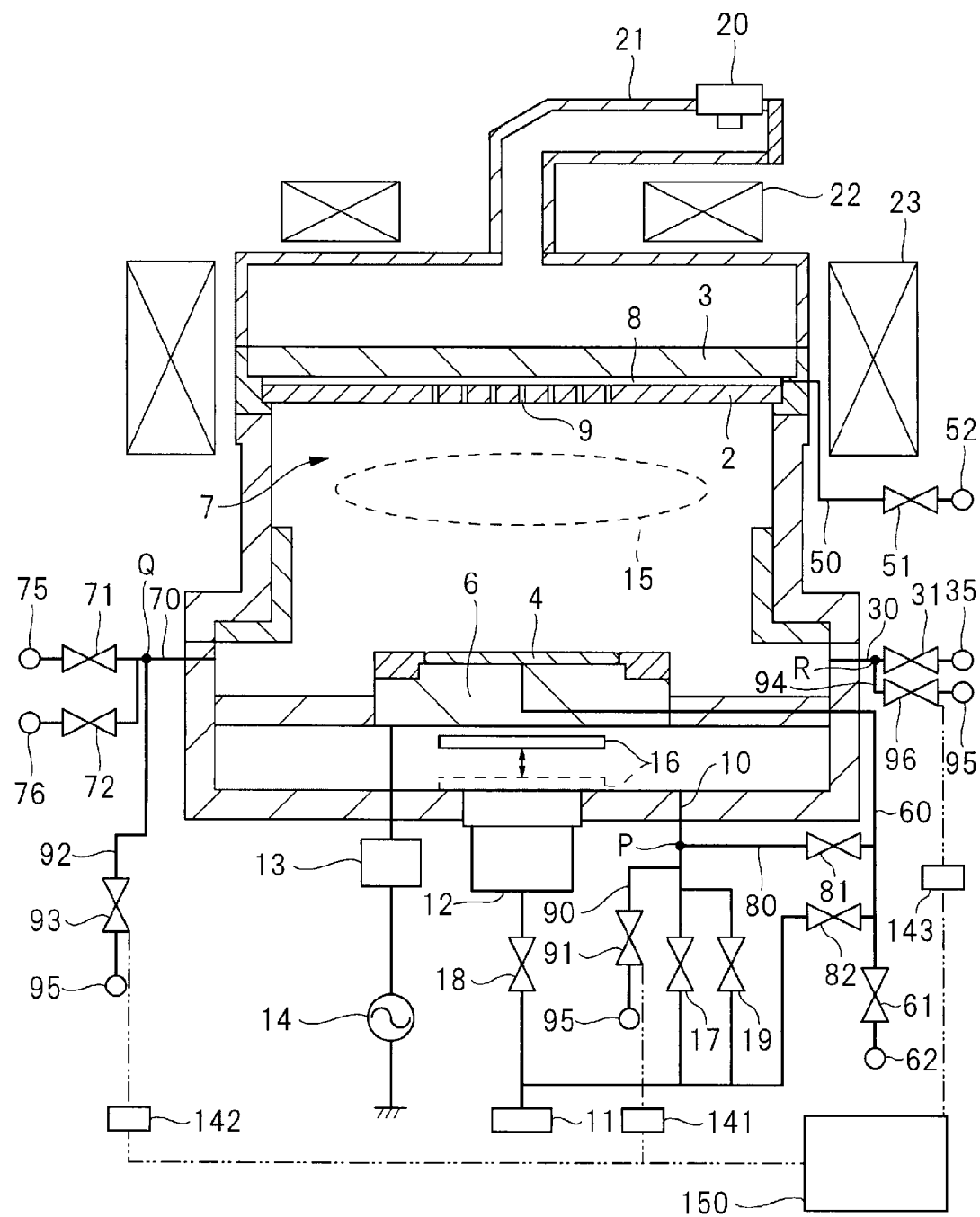
FIG. 7 is a sectional view illustrating an example of a schematic configuration of a plasma processing apparatus according to Embodiment 3 of the invention.

FIG. 7 is a sectional view illustrating an example of a schematic configuration of a plasma processing apparatus according to Embodiment 3 of the invention.

A case where the gas is supplied to the vent pipe 30 in the wet cleaning accompanying with the venting a processing apparatus to atmosphere illustrated in FIG. 7 is described. In FIG. 7, configurations, to which the same reference signs as those in FIG. 1 are assigned, have the same functions as those described in Embodiment 1, and thus the description thereof is omitted.

In the plasma processing apparatus of Embodiment 3 illustrated in FIG. 7, the vent pipe 30 is connected to the processing chamber 7, and thereby the gas supply source 95 that supplies the gas such as $N_2$ or dry air is supplied to the vent pipe 30. The gas supply source 95 is connected to a gas supplying pipe 94 via a valve 96. The gas supplying pipe 94 is connected to a portion (for example, an R portion illustrated in FIG. 7) between a connection position of the vent pipe 30 to the processing chamber 7 and the valve 31 which blocks the vacuum and the atmosphere from each other. Further, a third gas supplying mechanism 143 is provided to communicate with the vent pipe 30. The third gas supplying mechanism 143 supplies a third gas for purging a portion of the vent pipe 30 which is exposed to the atmosphere, the vent pipe being a supplying pipe of a gas that is supplied into the processing chamber 7 in order to perform the venting a processing chamber 7 to atmosphere. Examples of the third gas include $N_2$, dry air, or the like. The control device 150 controls the third gas supplying mechanism 143. Consequently, the control device 150 controls an opening and closing operation of the valve 96. Here, the control device 150 controls the third gas supplying mechanism 143 such that the third gas is continuously supplied to the portion of the vent pipe 30 which is exposed to the atmosphere, during a time from after the venting a processing chamber 7 to atmosphere to a start of evacuation of the processing chamber 7 in a case where the wet cleaning of the processing chamber 7 is performed by accompanying with the venting a processing chamber 7 to atmosphere. The gas supply source 95 may be the same as or different from the gas supply source 95 described in Embodiments 1 and 2.

The reaction products are slightly attached to an inside of the vent pipe 30 that is connected to the processing chamber 7, due to the etching process. Similar to the inner surface of the evacuating pipe 10, the He evacuating pipe 80, or the pipe 70, it is difficult to perform the plasma cleaning on the inner surface of the vent pipe 30, and thus the attachment amount of the reaction product gradually increases as the etching process is repeatedly performed. However, the attachment amount of the reaction product is small to the extent that it is difficult to visually check the amount.

When the wet cleaning accompanying with the venting a processing chamber to atmosphere is performed in such as state, the atmosphere reaches the vent pipe 30 when the ceramic plate (component) 3 is detached, for example. As described above, since the reaction product is attached to the inner surface of the vent pipe 30, the reaction product attached to the inner surface of the vent pipe 30 is likely to absorb moisture in the atmosphere.

In Embodiment 3, after the pressure in the processing chamber 7 reaches the atmospheric pressure, the valve 96 is opened before the ceramic plate 3 is detached, and the gas is supplied from the gas supply source 95 of $N_2$, dry air, or the like to the vent pipe 30 via the gas supplying pipe 94. Before the atmosphere is mixed in the processing chamber 7, a gas is supplied to the vent pipe 30, and thereby it is possible to suppress absorption of the moisture in the atmosphere by the reaction product attached to the inner surface of the vent pipe 30 even after the ceramic plate 3 is detached. In addition, even after the ceramic plate 3 is detached, the gas is continuously supplied to the vent pipe 30. Therefore, it is also possible to suppress the absorption of the moisture in the atmosphere by the reaction product attached to the inner surface of the vent pipe 30 from the detachment of the component such as the ceramic plate 3 constituting the processing chamber 7 to attachment of a clean component. Then, when various components such as the ceramic plate 3 constituting the processing chamber 7 are attached, and there is no concern that the atmosphere will be mixed in the processing chamber 7, the valve 96 is closed, and gas supply to the vent pipe 30 is stopped. Consequently, it is possible to suppress the absorption of the moisture by the reaction product that is attached to the vent pipe 30.

Embodiment 3 employs a configuration of the device in a case where the valve 96 and the gas supplying pipe 94 are provided to the vent pipe 30 such that the gas is supplied; however, the gas such as the $N_2$ gas or dry air which is supplied to the gas supply source 35 may be supplied to the vent pipe 30.

Figure 8:
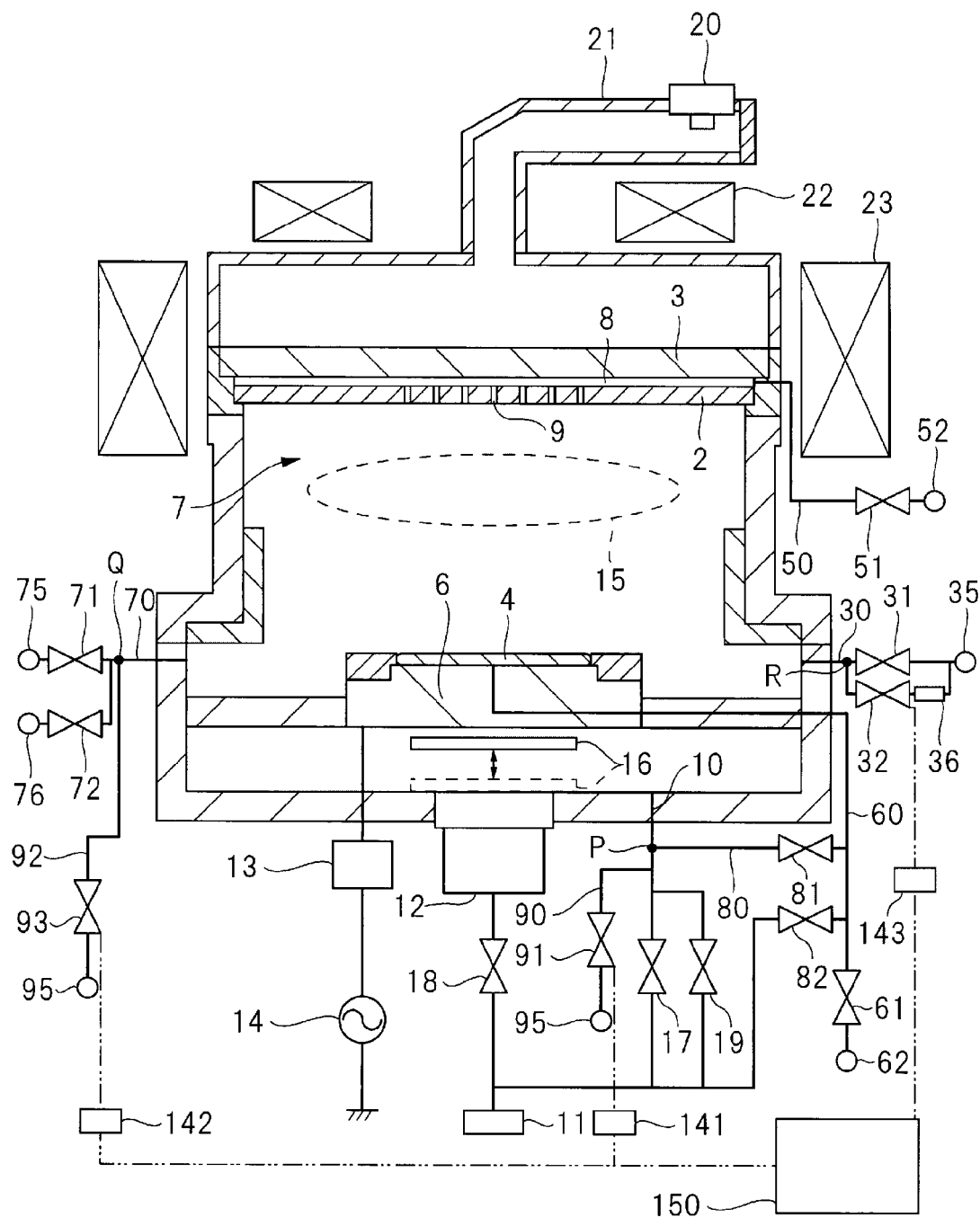
FIG. 8 is a sectional view illustrating an example of a schematic configuration of a plasma processing apparatus of a modification example according to Embodiment 3 of the invention.

Here, FIG. 8 is a sectional view illustrating a schematic configuration of a plasma processing apparatus of a modification example according to Embodiment 3 of the invention. In the plasma processing apparatus of the modification example illustrated in FIG. 8, the gas that is supplied from the gas supply source 35 is used for the venting a processing chamber 7 to atmosphere, and thus a high flow rate of gas is supplied by a high flow rate; however, as illustrated in FIG. 8, the valve 31 and a valve 32 may be provided in parallel, and a mass flow controller 36 may be provided between the valve 32 and the gas supply source 35.

In other words, in a case where the gas such as the $N_2$ gas or the dry air is supplied to the vent pipe 30 from the gas supply source 35, the valve 32 is opened in a state in which the valve 31 is closed, and the mass flow controller 36 sets a flow rate of supplying. In this manner, it is possible to prevent the gas from being supplied by the high flow rate to the vent pipe 30.

As described above, also in the vent pipe 30 connected to the processing chamber 7 described in Embodiment 3 and the modification example, the gas is supplied to the vent pipe 30 in the wet cleaning accompanying with the venting a processing chamber to atmosphere, and thereby it is possible to suppress the absorption of the moisture by the reaction product attached to the vent pipe 30 due to mixing with the atmosphere. Therefore, it is possible to reduce the occurrence of outgassing due to the moisture during the vacuum evacuation. In addition, the decrease in the moisture during the vacuum evacuation enables the substrate or the pipe, which constitutes the processing chamber 7, from being corroded even when the processing gas is supplied, and thus it is possible to reduce the particle and the occurrence of contamination. Consequently, it is possible to reduce the pattern defect or the degradation of device performance, and thus it is possible to improve the yield of products.

As described above, in the plasma processing apparatuses and a wet cleaning method according to Embodiments 1 to 3, the gas such as $N_2$ or dry air is supplied to the pipe connected to the processing chamber 7 in the wet cleaning accompanying with the venting a processing chamber to atmosphere, and thereby it is possible to suppress the absorption of the moisture by the reaction product attached to the pipe due to mixing with the atmosphere. Therefore, it is possible to reduce the occurrence of outgassing due to the moisture during the vacuum evacuation. In addition, the decrease in the moisture during the vacuum evacuation enables the substrate or the pipe, which constitutes the processing chamber 7, from being corroded even when the processing gas is supplied, and thus it is possible to reduce the particle and the occurrence of contamination. Consequently, it is possible to reduce the pattern defect or the degradation of device performance, and thus it is possible to improve the yield of products.

As described above, the invention made by the inventors is specifically described, based on the embodiments of the invention; however, the invention is not limited to the embodiments of the invention described above, and it is needless to say that it is possible to perform various modifications in a range without departing from the gist of the invention.

The invention is not limited to the embodiments described above and includes various modification examples. For example, the embodiments above are described in detail for easy understanding of the invention, and the invention is not absolutely limited to inclusion of the entire configuration described above.

In addition, it is possible to replace a part of a configuration of an embodiment with a configuration of another embodiment, and it is possible to add a configuration of an embodiment to a configuration of another embodiment. In addition, it is possible to add, remove, or replace a part of each of the configurations of the embodiments to, from, or with another configuration. Each member or a relative size described in the figures is simplified or idealized in the description for easy understanding of the invention and is more complicated in terms of implementation.

In addition, the invention is characterized in that the gas such as $N_2$ or dry air is supplied to the pipe connected to the processing chamber 7 in the wet cleaning, and it is possible to suppress the absorption of the moisture by the reaction product attached to the inner surface of the pipe; however, the invention is applicable to the He supplying pipe 60 or the processing gas supplying pipe 50. In other words, the gas is supplied to the He supplying pipe 60 or the processing gas supplying pipe 50 in the wet cleaning, and thereby it is possible to suppress the absorption of the moisture in the atmosphere to the inner surface of the pipe.

In addition, the invention is not limited to the above-mentioned electron cyclotron resonance type plasma processing apparatus and is applicable to an inductively coupled plasma (ICP) processing device, a capacitively coupled plasma (CCP) processing device, or the like, for example.

Further, the invention is not limited to the field of manufacturing of the semiconductor device or inspection and is applicable to various fields of manufacturing a flat panel display, a processing device using the plasma, or the like.

In addition, in Embodiments 1 to 3, a case where the plasma processing apparatus includes the first gas supplying mechanism 141, a case where the plasma processing apparatus includes the first gas supplying mechanism 141 and the second gas supplying mechanism 142, and a case where the plasma processing apparatus includes the first gas supplying mechanism 141, the second gas supplying mechanism 142, and the third gas supplying mechanism 143 are described as examples, respectively. The case where the gas is supplied to the portion of each of the evacuating pipe 10, the He evacuating pipe 80, the pipe 70, or the vent pipe 30, which is exposed to the atmosphere, is described.

Figure 10:
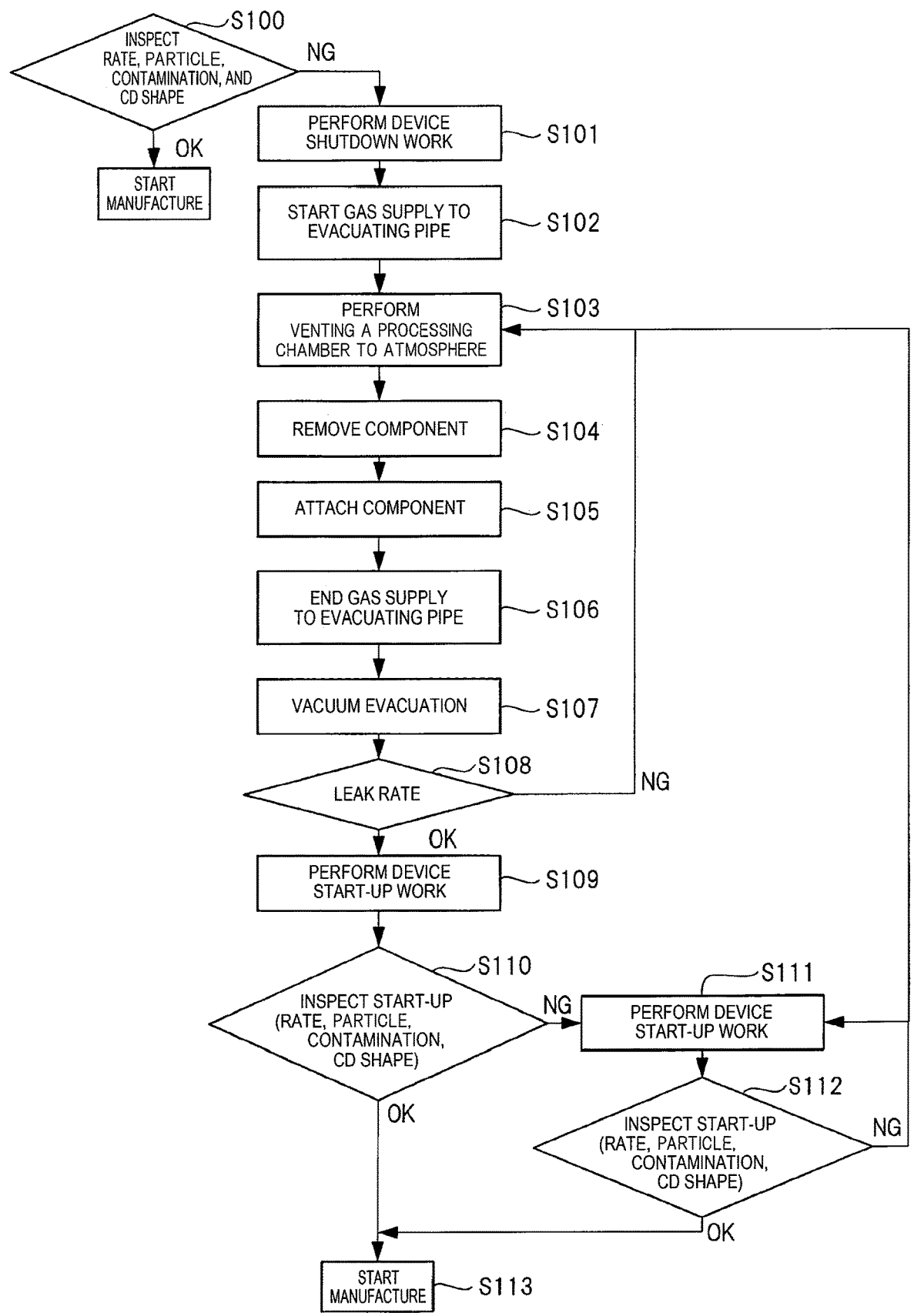
FIG. 10 is a flowchart illustrating a procedure of wet cleaning of a modification example of the plasma processing apparatus illustrated in FIG. 1.

However, in each of the plasma processing apparatuses of Embodiments 1 to 3 described above, the first gas supplying mechanism 141 and the third gas supplying mechanism 143 may be provided, for example. In this case, the first gas supplying mechanism 141 and the third gas supplying mechanism 143 may be the gas supplying mechanisms which are separately provided from each other or may be the same gas supplying mechanism. Further, in the case where the first gas supplying mechanism 141, the second gas supplying mechanism 142, and the third gas supplying mechanism 143 are provided, the mechanisms may be the same gas supplying mechanism. In addition, in Embodiments 1 to 3 described above, the case where the gas is supplied to the evacuating pipe 10 during a time from after the venting a processing chamber to atmosphere to the start of the evacuation of the processing chamber 7 when the gas such as $N_2$ or dry air is supplied to the pipe connected to the processing chamber 7 in the wet cleaning accompanying with the venting a processing chamber to atmosphere is described; however, the gas may be supplied to the pipe during a time from before the venting a processing chamber to atmosphere to the start of the evacuation of the processing chamber 7. In other words, as shown in a procedure of wet cleaning of a modification example illustrated in FIG. 10, the gas supply to the evacuating pipe is started before the venting a processing chamber to atmosphere. Consequently, since the gas is supplied to the pipe before the venting a processing chamber to atmosphere, it is possible to reduce the occurrence of outgassing due to the moisture during the vacuum evacuation.

In addition, in Embodiments 1 to 3, the case of the venting a processing chamber to atmosphere accompanying the wet cleaning is described; however, it is needless to say that the inventions according to Embodiments 1 to 3 are also applicable to a case where abnormality is detected during plasma processing other than the wet cleaning, the device is stopped, and it is necessary to perform the venting a processing chamber to atmosphere in a state in which the reaction products accumulated during the plasma processing remain in the processing chamber.

What is claimed is:

1. A method of venting a processing chamber to atmosphere, the method comprising:
   supplying a heat-transfer gas via a first valve to an evacuating pipe comprising a first portion and a second portion, wherein said first portion and said second portion are connected at a first connection position;
   supplying a purging gas via a second valve to the first and second portions of the evacuating pipe via a third pipe that is connected at a second connection position disposed upstream from the first connection position;
   venting a processing chamber to atmosphere through a vent pipe via a third valve such that the processing chamber reaches an atmospheric pressure;
   after the venting of the processing chamber to atmosphere and prior to a start of evacuation of the processing chamber, continuously supplying the purging gas via the second valve to the first portion of the evacuating pipe and to the second portion of the evacuating pipe to reduce moisture in the first and second portions of the evacuating pipe in order to prevent moisture absorption by a reaction product attached to an inner surface of the first and second portions of the evacuating pipe;
   maintaining the continuous supplying of the purging gas to the first portion of the evacuating pipe and to the second portion of the evacuating pipe during a state in which a ceramic plate which forms a top of the processing chamber is removed and returned;
   after returning the ceramic plate, performing a vacuum evacuation of the processing chamber at a first rate by closing the second valve to stop the flow of the purging gas, and opening a third valve while a fourth valve is closed; and
   after the pressure in the processing chamber reaches a predetermined pressure that is different from the atmospheric pressure, performing a vacuum evacuation of the processing chamber at a second rate that is higher than the first rate by closing the third valve and opening the fourth valve,
   wherein the first portion of the evacuating pipe is configured to reduce a pressure in the processing chamber having the atmospheric pressure, and the second portion of the evacuating pipe is configured to evacuate the heat-transfer gas after the heat-transfer gas is supplied to a back surface of a processing target object in order to transfer heat of a stage subjected to temperature adjustment, and
   wherein the step of continuously supplying the purging gas to the first and second portions of the evacuating pipe comprises continuously supplying the purging gas to the first connection position, and wherein the first connection position is located downstream of a purging gas supply source.

2. A method of venting a processing chamber to atmosphere, the method comprising:
   supplying a heat-transfer gas via a first valve to an evacuating pipe comprising a first portion and a second portion, wherein said first portion and said second portion are connected at a first connection position;
   supplying a purging gas via a second valve to the first and second portions of the evacuating pipe via a third pipe that is connected at a second connection position disposed upstream from the first connection position;
   venting a processing chamber to atmosphere through a vent pipe via a third valve such that the processing chamber reaches an atmospheric pressure;
   during a time starting before the venting of the processing chamber to atmosphere and prior to a start of evacuation of the processing chamber, continuously supplying the purging gas via the second valve to the first portion of the evacuating pipe and to the second portion of the evacuating pipe, to reduce moisture in the first and second portions of the evacuating pipe in order to prevent moisture absorption by a reaction product attached to an inner surface of the first and second portions of the evacuating pipe;
   maintaining the continuous supplying of the purging gas to the first portion of the evacuating pipe and to the second portion of the evacuating pipe during a state in which a ceramic plate which forms a top of the processing chamber is removed and returned;

after returning of the ceramic plate, performing a vacuum evacuation of the processing chamber at a first rate by closing the second valve to stop the flow of the purging gas, and opening a third valve while a fourth valve is closed; and after the pressure in the processing chamber reaches a predetermined pressure that is different from the atmospheric pressure, performing a vacuum evacuation of the processing chamber at a second rate that is higher than the first rate by closing the third valve and opening the fourth valve, wherein the first portion of the evacuating pipe is configured to reduce a pressure in the processing chamber having the atmospheric pressure, and the second portion of the evacuating pipe is configured to evacuate the heat-transfer gas after the heat-transfer gas is supplied to a back surface of a processing target object in order to transfer heat of a stage subjected to temperature adjustment wherein the step of continuously supplying the purging gas to the first and second portions of the evacuating pipe comprises continuously supplying the purging gas to the first connection position, and wherein the first connection position is located downstream of a purging gas supply source.

* * * * *